United States Patent
Kikuchi et al.

(10) Patent No.: US 10,861,739 B2
(45) Date of Patent: Dec. 8, 2020

(54) METHOD OF PATTERNING LOW-K MATERIALS USING THERMAL DECOMPOSITION MATERIALS

(71) Applicant: Tokyo Electron Limited, Tokyo (JP)

(72) Inventors: Yuki Kikuchi, Albany, NY (US);
Toshiharu Wada, Albany, NY (US);
Kaoru Maekawa, Albany, NY (US);
Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/440,679

(22) Filed: Jun. 13, 2019

(65) Prior Publication Data

US 2019/0385903 A1 Dec. 19, 2019

Related U.S. Application Data

(60) Provisional application No. 62/685,393, filed on Jun. 15, 2018, provisional application No. 62/700,708, filed on Jul. 19, 2018.

(51) Int. Cl.
| | |
|---|---|
| *H01L 21/768* | (2006.01) |
| *H01L 21/311* | (2006.01) |
| *H01L 21/324* | (2006.01) |
| *H01L 21/02* | (2006.01) |

(52) U.S. Cl.
CPC .. *H01L 21/76802* (2013.01); *H01L 21/02118* (2013.01); *H01L 21/31144* (2013.01); *H01L 21/324* (2013.01)

(58) Field of Classification Search
CPC ......... H01L 21/76802; H01L 21/31144; H01L 21/324; H01L 21/02118; H01L 21/31138; H01L 21/76804; H01L 21/76808; H01L 21/76814
See application file for complete search history.

(56) References Cited

U.S. PATENT DOCUMENTS 4,519,872 A * 5/1985 Anderson, Jr. ......... G03F 7/039
204/192.32

* cited by examiner

*Primary Examiner* — Nadine G Norton
*Assistant Examiner* — Mahmoud Dahimene
(74) *Attorney, Agent, or Firm* — Rothwell, Figg, Ernst & Manbeck P.C.

(57) ABSTRACT

A process is provided in which low-k layers are protected from damage by the use of thermal decomposition materials. In one embodiment, the low-k layers may be low-k dielectric layers utilized in BEOL process steps. The thermal decomposition materials may be utilized to replace organic layers that typically require ashing processes to remove. By removing the need for certain ashing steps, the exposure of the low-k dielectric layer to ashing processes may be lessened. In another embodiment, the low-k layers may be protected by plugging openings in the low-k layer with the thermal decomposition material before a subsequent process step that may damage the low-k layer is performed. The thermal decomposition materials may be removed by a thermal anneal process step that does not damage the low-k layers.

20 Claims, 8 Drawing Sheets

METHOD OF PATTERNING LOW-K MATERIALS USING THERMAL DECOMPOSITION MATERIALS

This application claims priority to US Provisional Patent Application No. 62/685,393, entitled, "Patterning without Low-K Damage by Thermal Decomposition Material," filed Jun. 15, 2018 and US Provisional Patent Application No. 62/700,708, entitled, "Method of Patterning Low-K Materials Using Thermal Decomposition Materials," filed Jul. 19, 2018; the disclosures of which are expressly incorporated herein, in their entirety, by reference.

BACKGROUND

The present disclosure relates to the processing of substrates. In particular, it provides a method for patterning of substrates.

As critical dimensions of features formed on substrates continue to shrink, the use of low dielectric constant (Low-k) materials (materials having a dielectric constant that is smaller than silicon dioxide) in substrate processing has become more important. Low-k materials may be used to form low-k layers that are utilized in a wide variety of points of a substrate process flow, including front end of line (FEOL) and back end of line (BEOL) process steps. It has been found, however, that various processing techniques commonly utilized in substrate processing may damage low-k materials. For example, plasma ashing processes, which are commonly utilized to remove a variety of materials from substrates, have been found to damage low-k materials. Such ashing processes, may be used, for example, to remove photoresist layers, organic dielectric layers, other organic layers, etc. Depending upon a particular substrate process flow, various low-k dielectric layers may have surfaces exposed during ashing processes. The ashing process may damage the low-k material by increasing the dielectric constant at the surface of the low-k layer, thus hindering the benefit of using a low-k material. Further, other types of dry and wet etching techniques commonly utilized in substrate processing may change the dielectric constant of a low-k layer or may impact the shape of exposed portions of the low-k layer.

Thus, it would be desirable to utilize a process flow in which low-k layers are not damaged due to ashing and etching process steps.

SUMMARY

In one embodiment, a process is provided in which low-k layers are protected from damage by the use of thermal decomposition materials. In one embodiment, the low-k layers may be low-k dielectric layers utilized in BEOL process steps. The thermal decomposition materials may be utilized to replace organic layers that typically require ashing processes to remove. By removing the need for certain ashing steps, the exposure of the low-k dielectric layer to ashing processes may be lessened. In another embodiment, the low-k layers may be protected by plugging openings in the low-k layer with the thermal decomposition material before a subsequent process step that may damage the low-k layer is performed. The thermal decomposition materials may be removed by a thermal anneal process step that does not damage the low-k layers.

In another embodiment, a method of etching a substrate is provided. The method may comprise providing a first layer on the substrate and providing a first patterned layer having a first pattern on the substrate. The method further comprises providing one or more intervening layers between the first patterned layer and the first layer, at least one intervening layer being a first thermal decomposition layer. The method further comprises etching the first layer to form the first pattern in the first layer, and removing the first thermal decomposition layer by applying first thermal energy to the first thermal decomposition layer in a process chamber, wherein a temperature of the substrate is 400 degrees C. or less.

In yet another embodiment, a method of etching a substrate is provided. The method may comprise providing a substrate with a first patterned layer and providing a metal hard mask (MHM) on at least top portions of the first patterned layer. The method further comprises performing a deposition of a thermal decomposition layer and performing a removal of a portion of the thermal decomposition layer. The method further comprises removing the MHM, performing a corner rounding process, and removing the thermal decomposition layer by applying thermal energy to the thermal decomposition layer.

In still yet another embodiment, a method of processing a substrate is provided. The method may comprise providing a first patterned layer on the substrate, the first patterned layer being a low-k dielectric layer. The method further comprises providing a second layer at least on tops of the first patterned layer, and forming plugs between portions of the first patterned layer, the plugs being comprised of a thermal decomposition material. The method further comprises removing the second layer from at least the tops of the first patterned layer. The method further comprises utilizing the plugs to protect at least a portion of the first patterned layer during the removing the second layer and removing the plugs by applying thermal energy to the first thermal decomposition layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A process is provided in which low-k layers are protected from damage by the use of thermal decomposition materials. In one embodiment, the low-k layers may be low-k dielectric layers utilized in BEOL process steps. The thermal decomposition materials may be utilized to replace organic layers that typically require ashing processes to remove. By removing the need for certain ashing steps, the exposure of the low-k dielectric layer to ashing processes may be lessened. In another embodiment, the low-k layers may be protected by plugging openings in the low-k layer with the thermal decomposition material before a subsequent process step that may damage the low-k layer is performed. The thermal decomposition materials may be removed by a heat based thermal process step that does not damage the low-k layers.

The heat based removal process for removing the thermal decomposition layer is not limited to a specific heat based removal mechanism. For example in one embodiment, thermal energy may be provided to the thermal decomposition layer by providing thermal energy to the ambient surrounding the thermal decomposition layer. In another embodiment, electromagnetic energy may be used to provide thermal energy to the thermal decomposition layer. For example in one embodiment, a laser may be used to heat the thermal decomposition layer or in another embodiment microwave energy may be used. It will be recognized that other methods may be used to heat the thermal decomposition layer such that a heat based removal mechanism is achieved.

As used herein, thermal decomposition material may decompose through, at least in part, the application of thermal energy to the material so that the material may be removed from the substrate via the application of the thermal energy. The thermal energy may be applied to the thermal decomposition material in a variety of manners. For example, heating of the ambient around the decomposition material is one manner of applying thermal energy. In another example, a laser, microwave or other electromagnetic energy may be used to create thermal energy in the thermal decomposition material.

The figures provided herein illustrate the use a thermal decomposition layer in a variety of process flows that addresses low-k dielectric layer damage described above. Thus, in one embodiment, changing of the dielectric constant of a low-k dielectric layer is suppressed by use of a thermal decomposition layer. In another embodiment, changing of the shape of the low-k dielectric layer is suppressed by use of a thermal decomposition layer. As shown in the figures, the exemplary uses of this process may be BEOL process steps. As mentioned above, the techniques described herein are not, however, limited to a BEOL process.

Figure 1A:
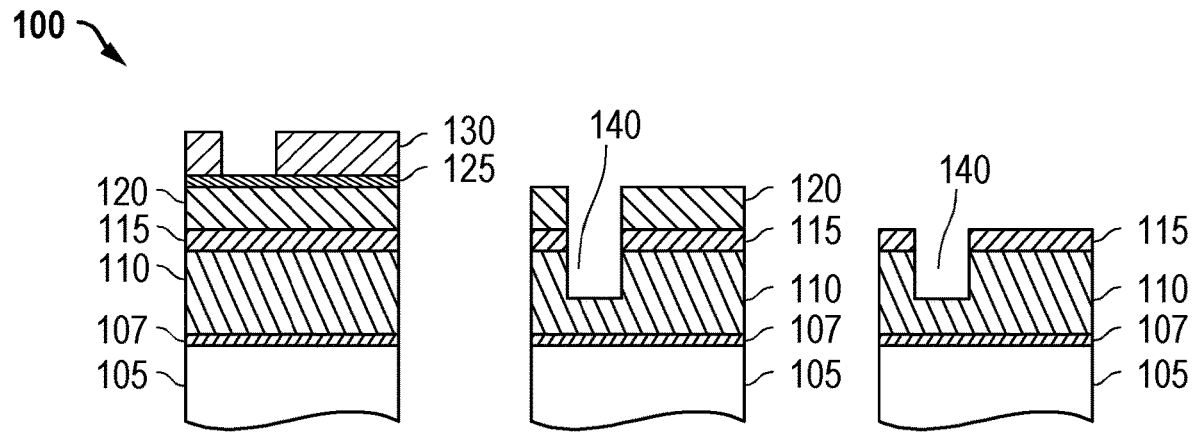
FIG. 1A illustrates an exemplary series of process steps including the use of a thermal decomposition layer to lessen damage to a low-k dielectric layer.

One embodiment of a process integration flow utilizing the thermal decomposition techniques described herein is shown in FIGS. 1A, 1B, 2A, and 2B. As shown in FIG. 1A, a structure 100 is initially provided and a series of process steps performed on the structure 100 is demonstrated. The structure 100 includes a substrate 105. Substrate 105 may be any substrate for which the use of patterned features is desirable. For example, in one embodiment, substrate 105 may be a semiconductor substrate having one or more semiconductor processing layers formed thereon. In one embodiment, the substrate 105 may be a substrate that has been subject to multiple semiconductor processing steps which yield a wide variety of structures and layers, all of which are known in the substrate processing art. In one exemplary embodiment, the structure 100 may be used as part of trench and via formation technique utilized at a back end of line (BEOL) processing step for processing a semiconductor wafer.

As shown in FIG. 1A, a low-k dielectric layer 110 is provided. In one embodiment, the low-k dielectric layer 110 may be a porous low-k material such as an SiCHO material. However, it will be recognized that various types of low-k dielectric layers may be utilized, including but not limited to, doped silicon dioxides (fluorine, carbon and other dopants), spin-on polymers (including organic and silicon based polymers), porous oxides, etc., all being well-known in the art. As is described later, a trench and via may be formed subsequently in the low-k dielectric layer 110. As shown in FIG. 1A, an etch stop layer 107 may underlie the low-k dielectric layer 110. A hard mask layer 115 may also be provided (in one embodiment a metal hard mask). A thermal decomposition layer 120 may also be provided. The thermal decomposition layer may be formed of a thermal decomposition material. An additional layer 125 may be provided (for example an antireflective coating layer, another hard mask layer, or any other layer utilized in the patterning process). In one exemplary embodiment the etch stop layer 107 may be silicon carbon nitride (SiCN), silicon nitride (SiN) or aluminium oxide ($AlO_x$), the hard mask layer 115 may be titanium nitride (TiN), and the additional layer 125 may be a silicon antireflective coating (SiARC). It will be recognized that other materials may be used however. Finally a photo resist layer 130 is provided with a pattern that corresponds to the desired trench pattern. Though not shown, more layers may also be utilized between the photo resist layer 130 and the etch stop layer 107. Alternatively, fewer layers may be utilized, for example etch stop layer 107 and/or additional layer 125 may not be utilized. Thus, it will be recognized that the particular stack of layers shown in FIG. 1A is merely exemplary and many other variations of layers may be utilized while still obtaining the benefits of the use of a thermal decomposition material as described herein.

The structure 100 of FIG. 1A may be similar to a wide variety of BEOL trench/via formation structures found in the substrate processing art except for the use of the thermal decomposition layer. For example, typical structures may utilize an organic dielectric layer (ODL) which may be plasma deposited or spun on the substrate. The ODL may be used, in some embodiments, to assist in substrate planarization. In a typical prior art process flows, the ODL will eventually be removed by a plasma ashing process which may damage the low-k dielectric layer. As opposed to prior art processes, the process flow shown in FIGS. 1A-2B utilizes a thermal decomposition layer 120 which when needed to be removed may be removed through a thermal process that does not damage the low-k dielectric layer 110. In one embodiment, the thermal decomposition layer may have a thickness in the range of 100 to 200 nm, though it will be recognized that usage of the concepts described herein is not limited to such a range and that the thicknesses may change as technology nodes shrink.

As shown in FIG. 1A, a trench 140 may then be formed in the low-k dielectric layer 110. The formation of trench 140 may be accomplished through the utilization of standard etch techniques (for example a plasma etch). The photo resist layer 130 and additional layer 125 may also be removed. In one embodiment, the photo resist may be etched away during the etching process which etches the thermal decomposition layer 120 and the additional layer 125 may be etched away during the etching process which etches the low-k dielectric layer 110. Then, the thermal decomposition layer 120 may be removed by utilizing a thermal process to achieve the final structure shown in FIG. 1A. As noted, the use of a thermal process (as opposed to an ashing process, plasma etch process, or wet etch process) provides for a low-k dielectric layer that is not damaged. Standard lithography layer stacks and standard etch techniques may otherwise be utilized.

As mentioned above, the application of thermal energy may be achieved by a variety of manners, including but not limited to heating of the ambient around the thermal decomposition layer, by the use of lasers, by the use of microwaves, etc. Due to the nature of the thermal removal process, the removal of the thermal decomposition layer 120 may be achieved without causing damage to the low-k dielectric layer 110. For example, the dielectric constant of the low-k dielectric layer 110 will not be increased due to the thermal removal process (as opposed to what occurs in ashing processes).

In one exemplary embodiment, the thermal decomposition layer 120 may be removed by subjecting the layer to a heating process of less than 400° Celsius (C). In another embodiment, the heating process may be a process that heats the substrate to a range of 300°-400° C. and in a yet another embodiment, between 325°-375° C. In one embodiment, the thermal decomposition layer removal process may occur by applying heat for five minutes. It will be recognized, however, that other temperatures and times may be utilized.

Figure 1B:
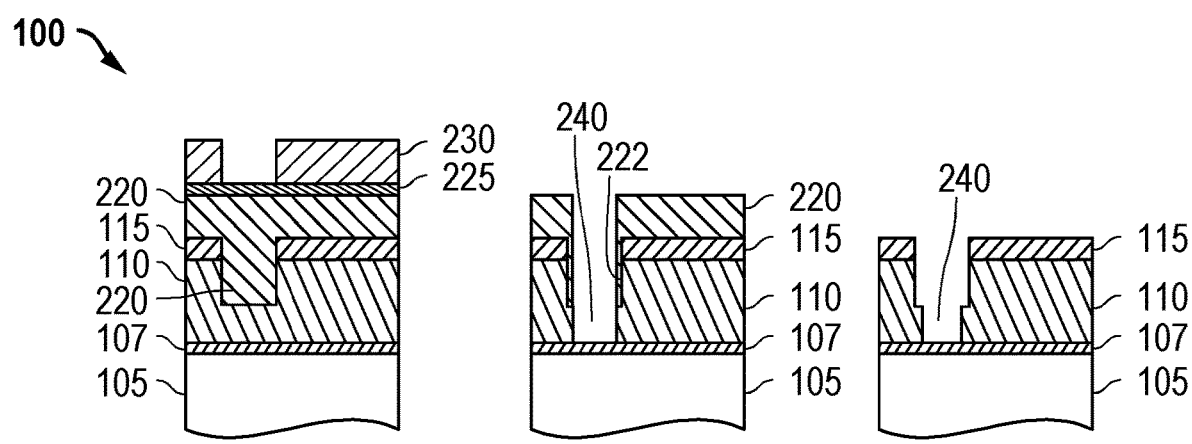
FIG. 1B illustrates an exemplary series of process steps which may be performed after the process steps of FIG. 1A, including a further use of a thermal decomposition layer.

FIG. 1A illustrates the formation of the trench 140. Processing may then continue as shown in FIG. 1B to form the via of the full trench full via structure by using the use of a second patterned layer having a second pattern and a second thermal decomposition layer. More specifically, as shown in FIG. 1B, the final structure of FIG. 1A is further processed by the additional of a second thermal decomposition layer 220, a second additional layer 225 and a second photo resist layer 230. The second thermal decomposition layer 220, the second additional layer 225 and the second photo resist layer 230 may be similar to the initial layers shown in FIG. 1A, except here the second photo resist layer 230 is patterned with the via pattern and the second thermal decomposition layer 220 fills the trench 140 as shown in FIG. 1B. Processing then continues by etching the via pattern as shown to create the via 240. As the via pattern may be smaller than the trench pattern, there may be second thermal decomposition layer portions 222 which remain on portions of the sidewalls of the low-k dielectric layer 110 as shown. Then, the second thermal decomposition layer 220 may be removed by a thermal process to yield the final structure of FIG. 1B without damaging the low-k dielectric layer 110.

Figure 2A:
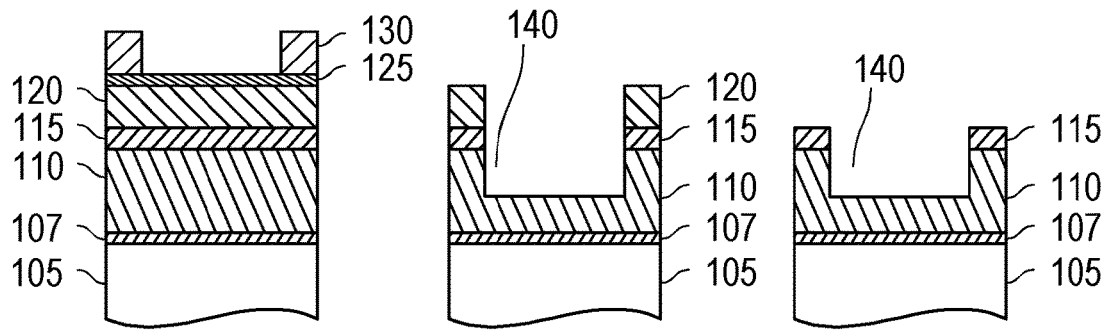
FIG. 2A illustrates the exemplary series of process steps of FIG. 1A, in a different cross-sectional view, including the use of a thermal decomposition layer to lessen damage to a low-k dielectric layer.
Figure 2B:
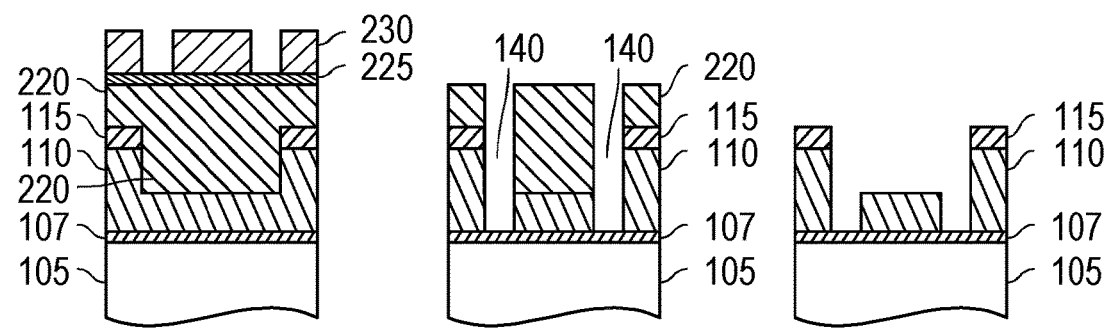
FIG. 2B illustrates the series of process steps of FIG. 1B, in a different cross-sectional view, which may be performed after the process steps of FIG. 2A, including a further use of a thermal decomposition layer.

FIGS. 1A-1B illustrate a cross section of the structure 100 and substrate 105 in a first direction (for example an X direction cross section). FIGS. 2A-2B illustrate the same layers of the structure 100 and substrate 105 as viewed through a cross section in a second perpendicular direction (for example a Y direction cross section) while utilizing like reference numbers.

The process described above may be used at a variety of process steps utilized in a substrate process flow. In one exemplary embodiment, the process described above may be part of a trench and via formation process (however, as mentioned, the techniques described herein are not limited to trench and via formation processes).

After the processing as shown in FIGS. 1A-2B, standard processing techniques may be utilized. However, in another embodiment, an additional usage of a thermal decomposition material may be provided to further protect the low-k dielectric layer 110. In this case, protection is provided to the low-k dielectric layer 110 to suppress damage that may occur during the process for removing the hard mask layer 115. In this alternate embodiment, thermal decomposition material is utilized to fill the trench and via regions before the hard mask layer 115.

Figure 3A:
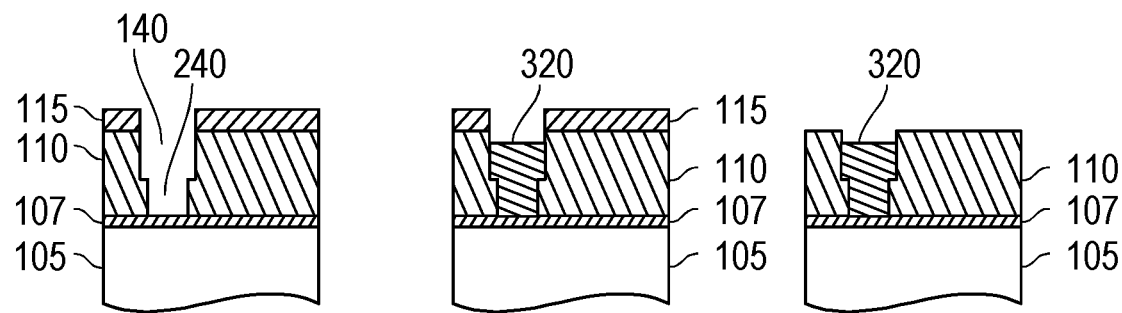
FIGS. 3A-3B illustrate an exemplary series of process steps which may be performed after the process steps of FIG. 1B, including a further use of a thermal decomposition layer.
Figure 3B:
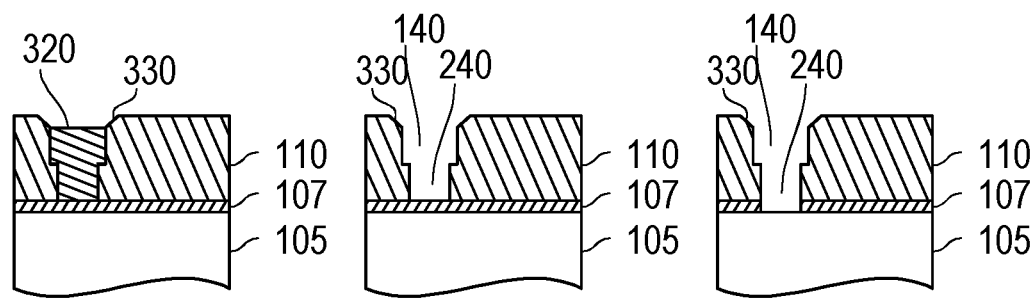

FIGS. 3A and 3B illustrate such an alternative embodiment. In the embodiment of FIGS. 3A and 3B thermal decomposition material is provided as plugs and the plugs suppress damage to a low-k dielectric layer. As shown in FIG. 3A, the process may begin with the final structure of FIG. 1B. Then as shown in FIG. 3A, the trench 140 and via 240 regions may be filled with thermal decomposition material. The filling may extend over the hard mask layer 115 (not shown). Then to provide the thermal decomposition material plug 320 as shown, the thermal decomposition may be etched or planarized back as shown. Next as shown in FIG. 3A, the hard mask layer 115 may be removed (for example via a plasma etch). The presence of the thermal decomposition material plug 320 suppresses damage to the low-k dielectric layer 110 as much of the sidewalls of the low-k dielectric layer 110 are covered by the thermal decomposition material plug 320 during the removal of the hard mask layer 115. Next as shown in FIG. 3B, the thermal decomposition material plug 320 may be removed by a thermal process as described above. Then the etch stop layer 107 may be etched. FIG. 3B further illustrates an optional additional corner rounding step that may be utilized before the removal of the thermal decomposition material plug 320. As shown in FIG. 3B, the corners of the low-k dielectric layer 110 may be rounded to provide improvement in the performance of the via and trench formation. Then, as shown, the thermal process may be utilized to remove the thermal decomposition material plug 320 to expose the trench 140 and via 240, this time with rounded upper corners 330. It will be recognized that such corner rounding is optional.

Figure 4A:
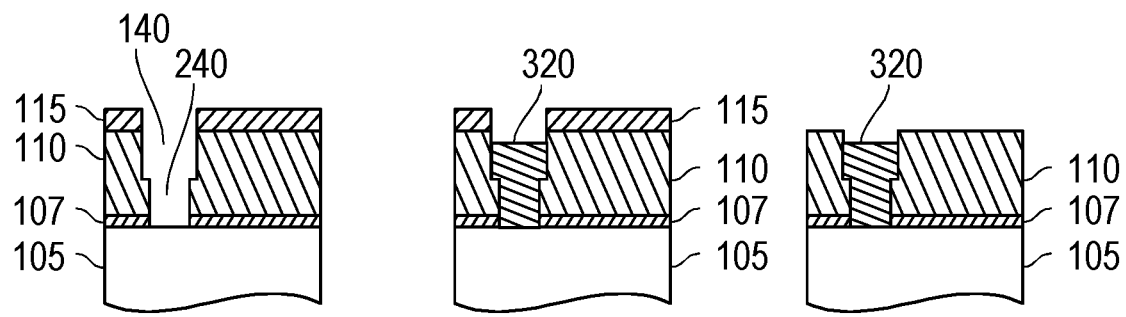
FIGS. 4A-4B illustrate an alternative exemplary series of process steps which may be performed after the process steps of FIG. 1B, including a further use of a thermal decomposition layer.
Figure 4B:
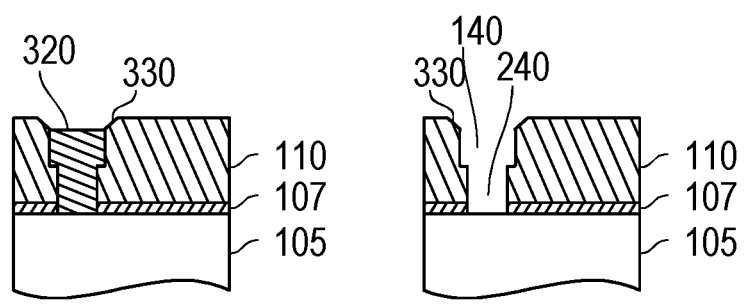

Yet another embodiment is illustrated in FIGS. 4A and 4B as a variation of the embodiment of FIGS. 3A and 3B. In the embodiment of FIGS. 4A and 4B, the etch stop layer 107 is first etched as shown in FIG. 4A. Similar processing as described in FIGS. 3A and 3B may then occur to provide the benefits of the thermal decomposition material plug 320 during the removal of the hard mask layer 115.

It will be recognized that the concept of using a thermal decomposition material plug to protect exposed portions of a low-k dielectric layer from other subsequent processing steps is not limited to a trench and via process flow (such as shown in FIGS. 1A-2B). Thus, it will be recognized that the techniques of FIGS. 1A-4B may be utilized in a variety of semiconductor processing steps. In fact, it will be recognized that a wide range of process flows may utilize the techniques disclosed herein of filling regions of a substrate or creating layers on a substrate with a thermal decomposition material so as to protect portions of a low-k dielectric layer from damage. The damage may be suppressed by allowing for thermal anneals to be utilized to remove layers from the substrate as opposed to ashing and/or etching steps. Further the damage may be suppressed by protecting the low-k dielectric layer from subsequent processes that may damage the low-k dielectric layer. The thermal decomposition materials may be removed merely through the use of thermal energy, a thermal process that may be utilized to remove the thermal decomposition material in a non-damaging fashion. Such techniques may be utilized at any of a wide variety of process steps which require the use of a low-k material.

Figure 5A:
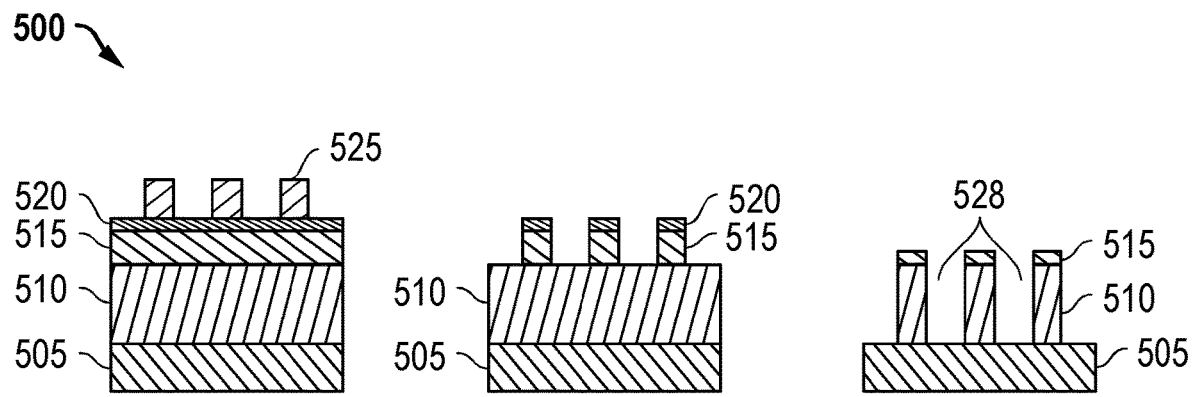
FIGS. 5A-5B illustrate another exemplary series of process steps including the use of a thermal decomposition layer to lessen damage to a low-k dielectric layer.
Figure 5B:
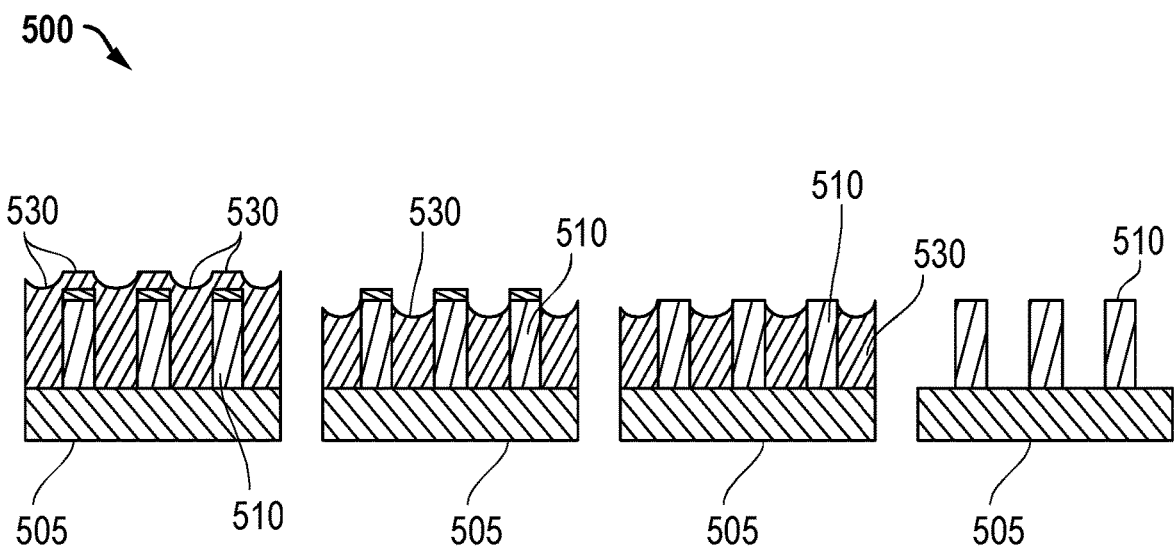

Yet another embodiment of suppressing damage to a low-k dielectric layer through the use of thermal decomposition material is shown in FIGS. 5A and 5B. As shown in FIGS. 5A and 5B, a process flow is provided that has an ashing step utilized to remove an organic dielectric layer (ODL), for example in one embodiment ODL-401 (a commercially available organic dielectric), however, other materials may be utilized. As shown in FIGS. 5A and 5B, a thermal decomposition material plug is added to the process flow to suppress damage to the low-k dielectric layer during the ashing step. FIG. 5A illustrates a structure 500 formed on a substrate 505 that includes a low-k dielectric layer 510 over which an organic dielectric layer 515 in FIG. 5A is formed. An additional layer 520 (for example a hard mask or an antireflective coating) is provided and a patterned photo resist layer 525 is provided. Using conventional techniques the additional layer and the organic dielectric layer may be etched as shown. Then the low-k dielectric layer 510 may be etched to create a patterned structure that includes the low-k dielectric layer 510 and the organic dielectric layer 515 patterned with corresponding spaces 528 as shown. Next, as shown in the initial step of FIG. 5B, the spaces 528 shown in FIG. 5A may be filled with a thermal decomposition material 530 which acts to plug the spaces 528. As shown, the thermal decomposition material 530 may extend over the patterned portions of the organic dielectric layer 515. Next, an ashing process may be performed to remove an upper portion of the thermal decomposition material 530 and the remaining portions of the organic dielectric layer 515. As a majority of the sidewalls of the low-k dielectric layer 510 are protected by the thermal decomposition material 530 during the ashing process, the thermal decomposition material 530 acts to suppress damage to the low-k dielectric layer during the ashing process. Next, an thermal anneal process, such as described above, may occur to remove the thermal decomposition material 530 so as to leave the final structure as shown in FIG. 5B comprised of the low-k dielectric layer 510 formed as a patterned layer. In this manner, a plug process is provided in which a thermal decomposition material plug is utilized to protect what would otherwise be exposed surfaces of the low-k dielectric layer during subsequent process steps.

In one embodiment, the thermal decomposition layer may be comprised of a material such a urea binding resin, specifically polyurea, which has depolymerizability and has characteristics that it can be removed by thermal treatment of less than 400° C., in another embodiment by thermal treatment in a process chamber to provide a substrate temperature having a temperature between 300° C. and 400° C. is utilized, however other temperatures may be utilized. Thus, through the application of thermal energy, the thermal decomposition layer depolymerizes. By using such thermal decomposition materials, as opposed to standard dielectric layers (such as standard ODL), the exposure of low-k dielectric layer to the ashing and/or etching processes at the time of ODL removal as occurs in prior art processes is eliminated. Because the thermal decomposition layer can be removed by thermal treatment, the influence on the low-k dielectric layer of the removal process can be eliminated. Therefore, the dielectric constant and shape of the low-k dielectric layer can be maintained even after multiple thermal removal steps. By using a thermal decomposition material, the use of ashing processes, plasma etch processes, etc. to remove certain layers becomes unnecessary and/or the exposure of a low-k layer to those processes is lessened and impact on the low-k dielectric layer can be suppressed.

The techniques described herein are not limited to a particular thermal decomposition material, as a variety of materials may be utilized while still obtaining the benefit of utilizing a thermal removal process so that the low-k layer is not damaged. However, in one embodiment a urea binding resin may be utilized. One specific embodiment of such a urea binding resin is polyurea which may be formed via a thin film deposition. Exemplary techniques for the formation of a polyurea and the removal of such a polyurea by a depolymerization process to thermal decompose the polyurea are described in more detail in U.S. patent application Ser. No. 15/654,307 filed Jul. 19, 2017, entitled "Method of Fabricating Semiconductor Device, Vacuum Processing Apparatus and Substrate Processing Apparatus," to Yatsuda et al., the disclosure of which is expressly incorporated herein by reference in its entirety. The techniques described in U.S. patent application Ser. No. 15/654,307 include, but are not limited to, copolymerizing isocyanate and amine as raw material monomers to form a urea bond, and as described, an exemplary a vapor deposition polymerization process may be utilized. As described in U.S. patent application Ser. No. 15/654,307, a liquid process may also be used to form the polyurea. Further, as described, the polyurea may be subsequently depolymerized to an amine and vaporized by the application of a thermal treatment. It will be recognized, however, that other formation processes and other removal processes may be utilized while still gaining the benefits of the use of a thermal decomposition layer and thermal removal of such layer as described herein. Further, it will be recognized that the techniques described herein are not limited to polyurea and other materials and/or combinations or variants of polyurea and other materials may be utilized.

It will be recognized that the process flows described above are merely exemplary, and many other processes and applications may advantageously utilize the techniques disclosed herein.

Figure 6:
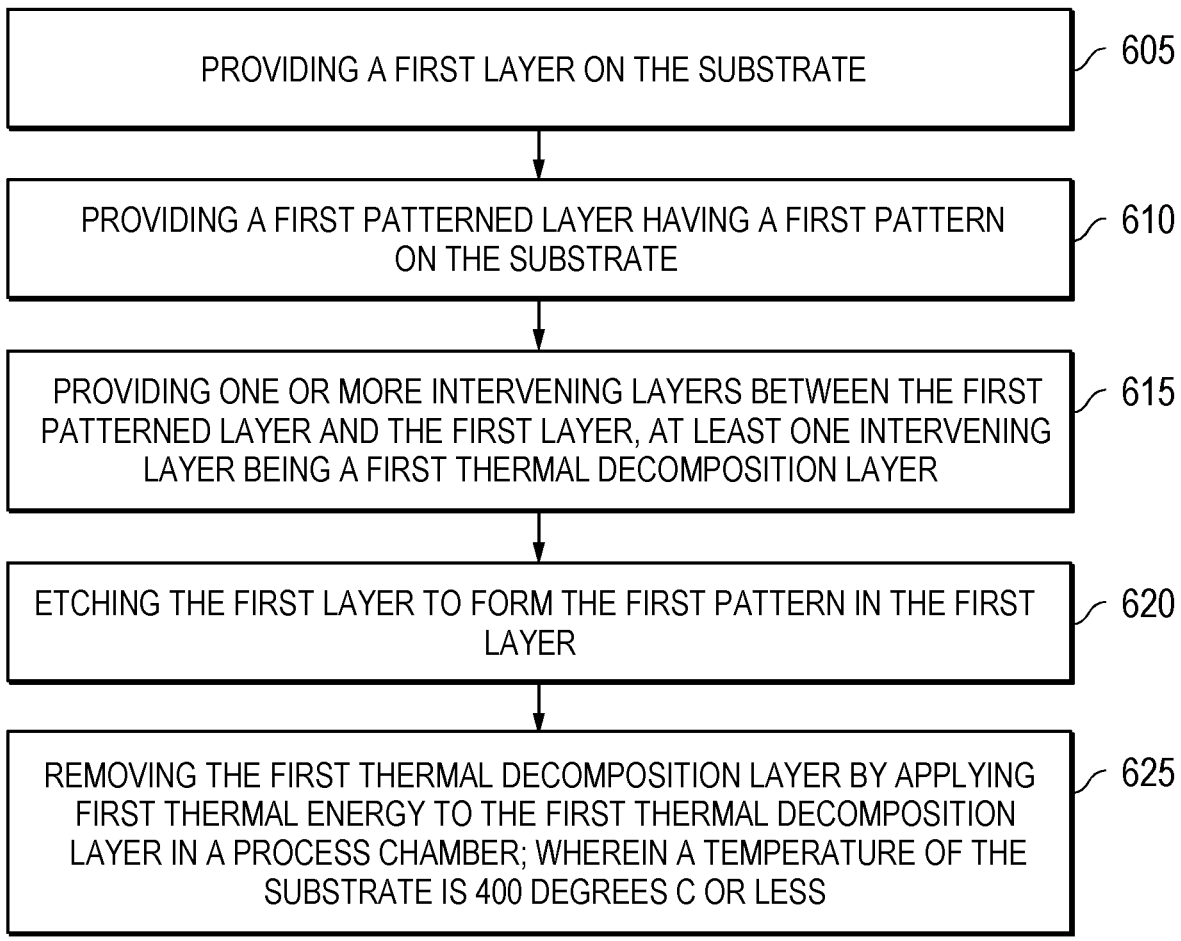
FIGS. 6-8 illustrate exemplary methods for using techniques disclosed herein.
Figure 7:
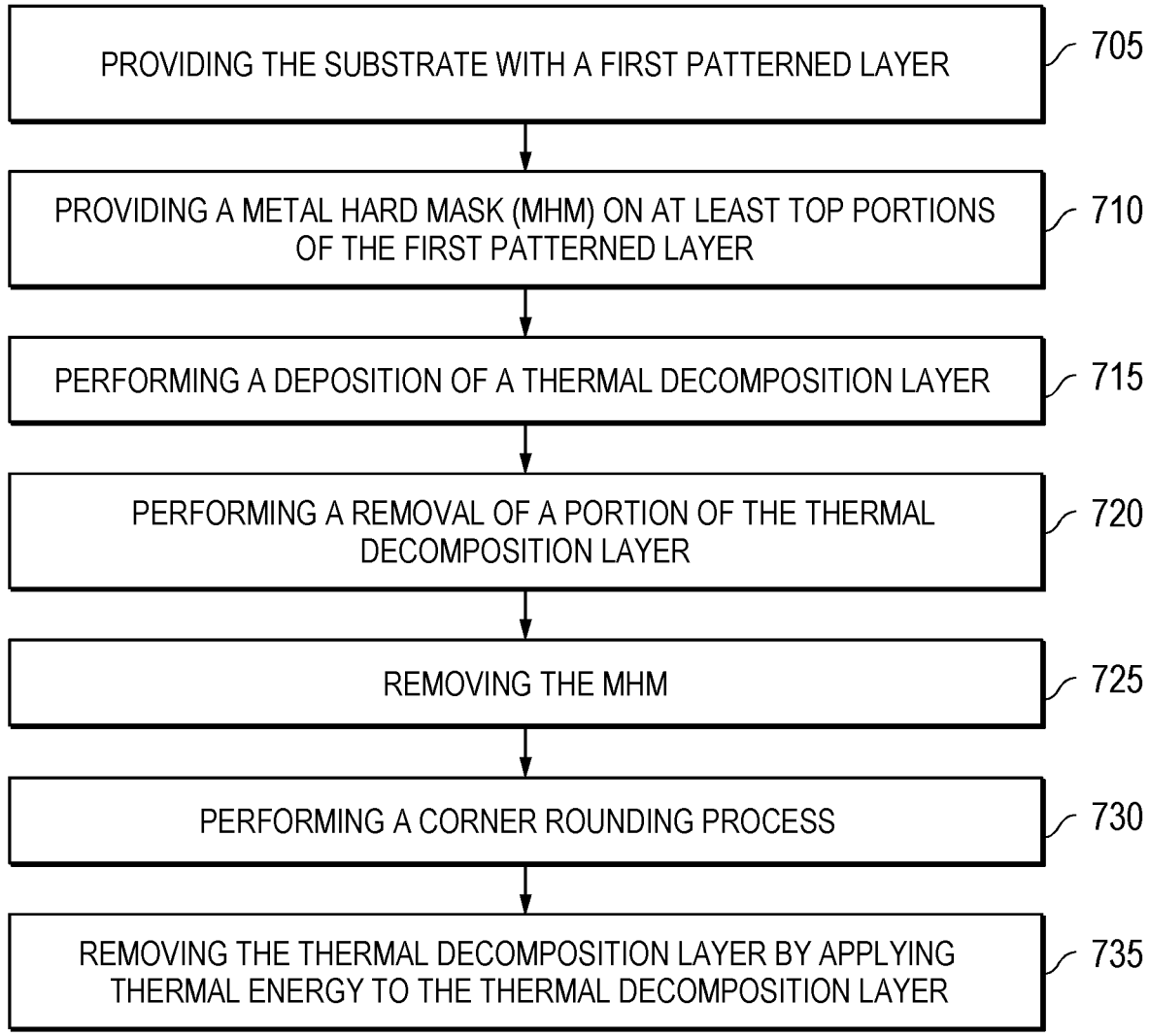
Figure 8:
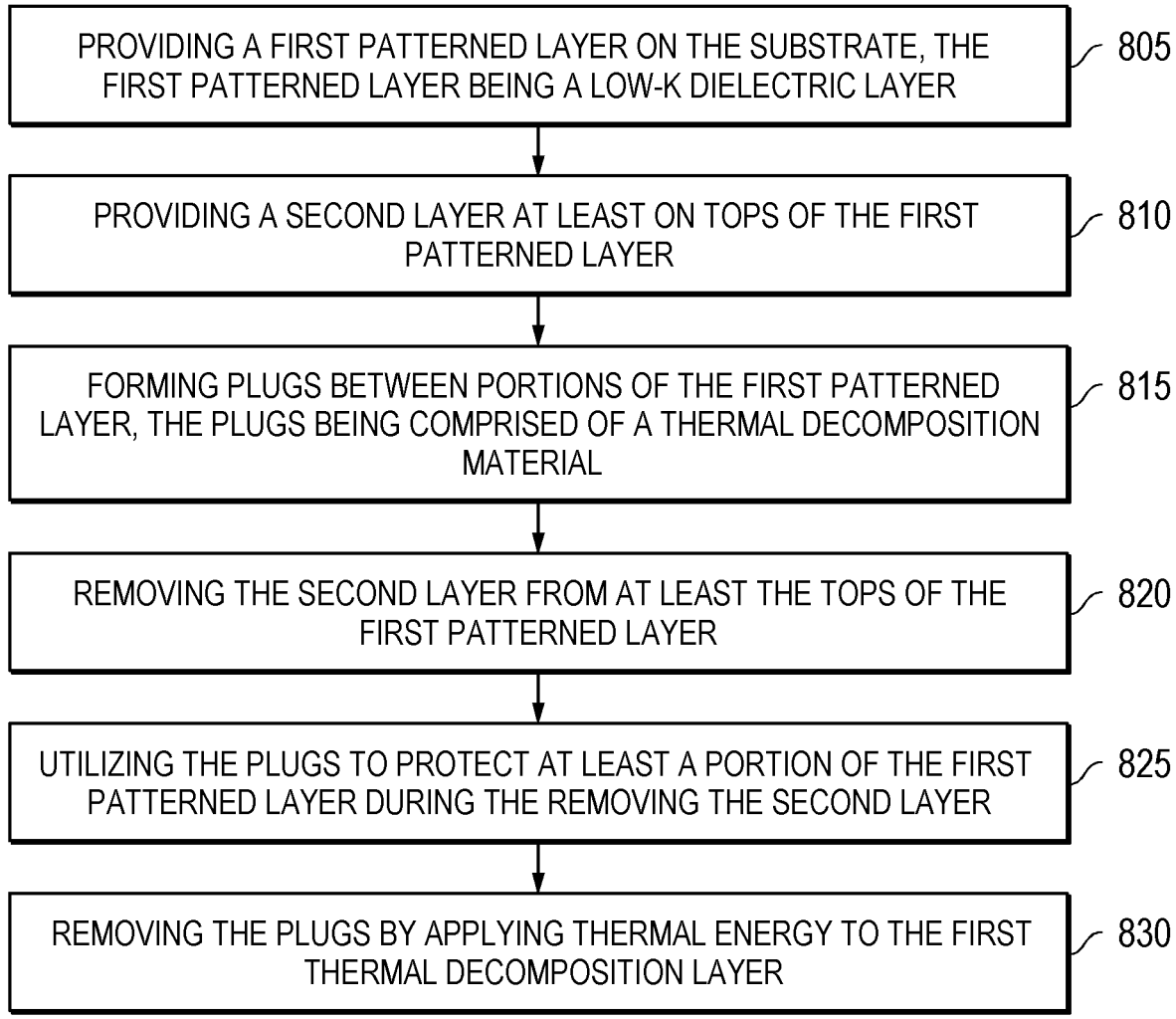

FIGS. 6-8 illustrate exemplary methods for use of the processing techniques described herein. It will be recognized that the embodiments of FIGS. 6-8 are merely exemplary and additional methods may utilize the techniques described herein. Further, additional processing steps may be added to the methods shown in the FIGS. 6-8 as the steps described are not intended to be exclusive. Moreover, the order of the steps is not limited to the order shown in the figures as different orders may occur and/or various steps may be performed in combination or at the same time.

In FIG. 6, a method for etching a substrate is shown. The method may include step 605 of providing a first layer on the substrate. The method further includes a step 610 of providing a first patterned layer having a first pattern on the substrate. The method also includes a step 615 of providing one or more intervening layers between the first patterned layer and the first layer, at least one intervening layer being a first thermal decomposition layer. The method further includes step 620 of etching the first layer to form the first pattern in the first layer and step 625 of removing the first thermal decomposition layer by applying first thermal energy to the first thermal decomposition layer in a process chamber; wherein a temperature of the substrate is 400 degrees C. or less.

In FIG. 7, a method for etching a substrate is shown. The method may include step 705 of providing the substrate with a first patterned layer and step 710 of providing a metal hard mask (MHM) on at least top portions of the first patterned layer. The method further includes step 715 of performing a deposition of a thermal decomposition layer, step 720 of performing a removal of a portion of the thermal decomposition layer, and step 725 of removing the MHM. The method further includes step 730 of performing a corner rounding process and step 735 of removing the thermal decomposition layer by applying thermal energy to the thermal decomposition layer.

In FIG. 8, a method for processing a substrate is shown. The method may include step 805 of providing a first patterned layer on the substrate, the first patterned layer being a low-k dielectric layer and step 810 of providing a second layer at least on tops of the first patterned layer. The method further includes step 815 of forming plugs between portions of the first patterned layer, the plugs being comprised of a thermal decomposition material and step 820 of removing the second layer from at least the tops of the first patterned layer. The method also includes step 825 of utilizing the plugs to protect at least a portion of the first patterned layer during the removing the second layer and step 830 of removing the plugs by applying thermal energy to the first thermal decomposition layer.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of etching a substrate, the method comprising:
   providing a first layer on the substrate;
   providing a first patterned layer having a first pattern on the substrate;
   providing one or more intervening layers between the first patterned layer and the first layer, at least one intervening layer being a first thermal decomposition layer, wherein the first thermal decomposition layer is removable by thermal energy without requiring ashing, plasma etching or wet etching;
   etching the first layer to form the first pattern in the first layer; and
   removing the first thermal decomposition layer by applying first thermal energy to the first thermal decomposition layer in a process chamber without ashing, plasma etching or wet etching, wherein a temperature of the substrate is 400 degrees C. or less;
   the method further comprising:
   providing a second patterned layer having a second pattern on the substrate;
   providing at least a second thermal decomposition layer between the second patterned layer and the first layer, wherein the second thermal decomposition layer is removable by thermal energy without requiring ashing, plasma etching or wet etching;
   etching the first layer to form the second pattern in the first layer; and
   removing the second thermal decomposition layer by applying second thermal energy to the second thermal decomposition layer in a second process chamber without ashing, plasma etching or wet etching; wherein a temperature of the substrate in the second process chamber is 300 degrees C. to 400 degrees C.

2. The method of claim 1, wherein the first layer is a low-k dielectric layer.

3. The method of claim 1, wherein the first thermal decomposition layer is material that depolymerizes through application of the first thermal energy.

4. The method of claim 3, wherein the first thermal decomposition layer depolymerizes by thermal treatment, wherein the temperature of the substrate is 300 degrees C. to 400 degrees C.

5. The method of claim 1, wherein the etching of the substrate is part of a trench and via formation process.

6. A method of etching a substrate, the method comprising:
   providing a first layer on the substrate;
   providing a first patterned layer having a first pattern on the substrate;
   providing one or more intervening layers between the first patterned layer and the first layer, at least one intervening layer being a first thermal decomposition layer, wherein the first thermal decomposition layer is removable by thermal energy without requiring ashing, plasma etching or wet etching;
   etching the first layer to form the first pattern in the first layer; and
   removing the first thermal decomposition layer by applying first thermal energy to the first thermal decomposition layer in a process chamber without ashing, plasma etching or wet etching, wherein a temperature of the substrate is 400 degrees C. or less,
   wherein the first thermal decomposition layer is comprised of a urea binding resin.

7. A method of etching a substrate, the method comprising:
   providing the substrate with a first patterned layer;
   providing a metal hard mask (MHM) on at least top portions of the first patterned layer;
   performing a deposition of a thermal decomposition layer, the thermal decomposition layer being removable by thermal energy without requiring ashing, plasma etching or wet etching;
   performing a removal of a portion of the thermal decomposition layer;
   removing the MHM;
   performing a corner rounding process; and
   removing the thermal decomposition layer, without ashing, plasma etching or wet etching, by applying thermal energy to the thermal decomposition layer.

8. The method of claim 7, wherein the first patterned layer is a low-k dielectric layer.

9. The method of claim 8, wherein the thermal decomposition layer is material that depolymerizes through application of the thermal energy.

10. The method of claim 9, wherein the thermal decomposition layer is comprised of a urea binding resin.

11. The method of claim 10, wherein the thermal energy is applied by heating the substrate to a temperature between 300 degrees C. to 400 degrees C.

12. The method of claim 7, wherein the first patterned layer is a low-k dielectric material;
   after the performing the removal of the portion of the thermal decomposition layer, a corner of the low-k dielectric is exposed while portions of the low-k dielectric material below the corner are covered by thermal decomposition layer, and the corner rounding is performed on the exposed corner with the portions of the low-k dielectric material below the corner covered by the thermal decomposition layer; and
   the removing the thermal decomposition layer by applying thermal energy is performed after the corner rounding.

13. A method of processing a substrate, the method comprising:
   providing a first patterned layer on the substrate, the first patterned layer being a low-k dielectric layer;
   providing a second layer at least on tops of the first patterned layer;
   forming plugs between portions of the first patterned layer, the plugs being comprised of a thermal decomposition material, wherein the thermal decomposition material is removable by thermal energy without requiring ashing, plasma etching or wet etching;
   removing the second layer from at least the tops of the first patterned layer;
   utilizing the plugs to protect at least a portion of the first patterned layer during the removing the second layer; and
   removing the plugs by applying thermal energy to the thermal decomposition material without ashing, plasma etching or wet etching.

14. The method of claim 13, wherein the plugs suppress changing of a dielectric constant of the first patterned layer during the removing the second layer.

15. The method of claim 14, wherein the thermal decomposition material of the plugs is comprised of material that depolymerizes through application of the thermal energy.

16. The method of claim 15, wherein the thermal decomposition material is comprised of a urea binding resin.

17. The method of claim 15, wherein the second layer is an organic dielectric layer.

18. The method of claim 15, wherein the second layer is a metal hard mask.

19. The method of claim 15, wherein the thermal energy is applied by heating the substrate to a temperature between 300 degrees C. to 400 degrees C.

20. The method of claim 13, wherein the thermal energy is applied by heating the substrate to a temperature between 300 degrees C. to 400 degrees C.

* * * * *